(12) United States Patent
Berens et al.

(10) Patent No.: US 6,272,183 B1
(45) Date of Patent: Aug. 7, 2001

(54) METHOD FOR DATA TRANSMISSION ON TRANSMISSION CHANNELS IN A DIGITAL TRANSMISSION SYSTEM

(75) Inventors: Friedbert Berens, Geneva (CH); Markus Doetsch; Joerg Plechinger, both of Munich (DE); Peter Jung, Otterberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/510,638

(22) Filed: Feb. 22, 2000

Related U.S. Application Data

(63) Continuation of application No. PCT/DE98/02166, filed on Jul. 29, 1998.

(30) Foreign Application Priority Data

Aug. 22, 1997 (DE) .............................. 197 36 625

(51) Int. Cl.⁷ .............................. H04L 5/12; H03M 13/00
(52) U.S. Cl. .......................................... 375/262; 714/786
(58) Field of Search .................................. 375/262, 341; 714/786, 790, 746

(56) References Cited

U.S. PATENT DOCUMENTS

| | | |
|---|---|---|
| 5,214,687 | 5/1993 | Känsäkoski et al. . |
| 5,983,384 * | 11/1999 | Ross ........................ 714/755 |
| 6,061,387 * | 5/2000 | Yi ............................ 375/142 |
| 6,088,387 * | 7/2000 | Gelblum et al. ........ 375/222 |
| 6,119,264 * | 9/2000 | Berrou et al. ........... 714/786 |

FOREIGN PATENT DOCUMENTS

| | | |
|---|---|---|
| 0 755 122 A2 | 1/1997 | (EP) . |
| 1-286538 | 11/1989 | (JP) . |

OTHER PUBLICATIONS

Patrick Robertson: "Illuminating the Structure of Code and Decoder of Parallel Concatenated Recursive Systematic (Turbo) Codes", GLOBECOM, vol. 3, Nov. 28–Dec. 2, 1994, pp. 1298–1303.

Peter Jung: "Comparison of Turbo–Code Decoders Applied to Short Frame Transmissions Systems", IEEE Journal on Selected Areas in Communications, vol. 14, No. 3, Apr. 1996, pp. 530–537.

D. Divsalar et al.: "Turbo Codes for PCS Applications", ICC '95, Seattle, Washington, Jun. 18–22, 1995.

Claude Berrou et al.: "Near Shannon Limit Error–Correcting Coding and Decoding: Turbo–Codes (1)", IEEE Int. Conf. On Communications, 1993, pp. 1064–1070.

(List continued on next page.)

Primary Examiner—Temesghen Ghebretinsae
(74) Attorney, Agent, or Firm—Herbert L. Lerner; Laurence A. Greenberg; Werner H. Stemer

(57) ABSTRACT

In a method for data transmission on transmission channels in a digital transmission system, turbo coding is carried out in a turbo coder at a transmitter end for channel coding, and turbo decoding with soft-decision output signals is carried out in a turbo decoder at the receiver end. In order to improve the quality of service, the quality of service is determined from the variances of the soft-output signals at the turbo decoder, and the coding rate is set by adaptation of the puncturing such that a predetermined quality of service is obtained. Alternatively, the number of decoding iterations is set as a function of the quality of service. If a MAP symbol assessor is used at the receiver end, the variances $\sigma^2_{LLR}$ of the soft-decision output signals from the turbo decoder are determined, and the bit error rate is calculated from the variances $\sigma^2_{LLR}$ as a measure of the quality of service.

11 Claims, 5 Drawing Sheets

OTHER PUBLICATIONS

Catherine Douillard et al.: "Iterative Correction of Intersymbol Interference: Turbo–Equalization", ETT Eur. Trans. on Telecomm., vol. 6, No. 5, Oct. 1995, pp. 507–511. Peter Jung et al.: "Applying Turbo–Codes to the Uplink in a JD–CDMA Mobile Radio System Using Coherent Receiver Antenna Diversity", ITG Fachbericht 130, 1994, VDE-Verlag, pp. 49–56.

Robert H. Deng: "A Type I Hybrid ARQ System with Adaptive Code Rates", IEEE Transactions on Communications, vol. 43, No. 2/4, Part 2, Feb./Apr. 1995, pp. 733–737.

Markus Nasshan et al.: "New Results on the Application of Antenna Diversity and Turbo–Codes in a JD–CDMA Mobile Radio System", PIMRC '94 and WCN, Den Haag, NL, vol. 2, Sep. 18–23, 1994, pp. 524–528.

* cited by examiner

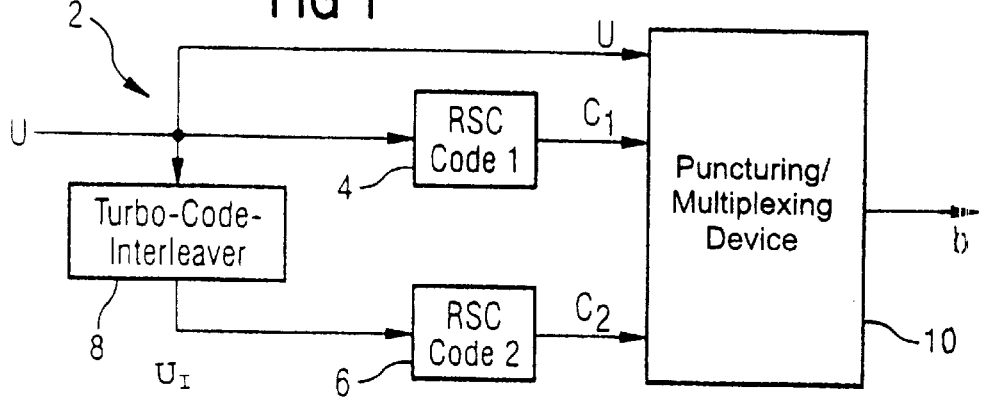
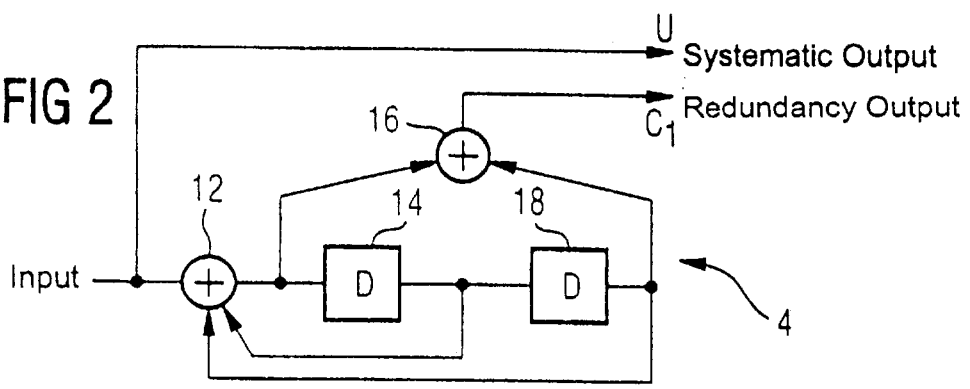
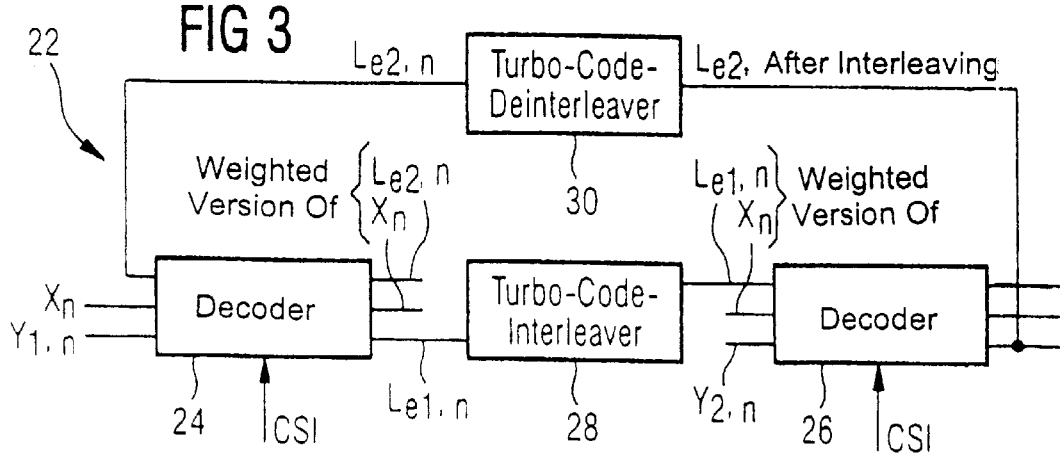

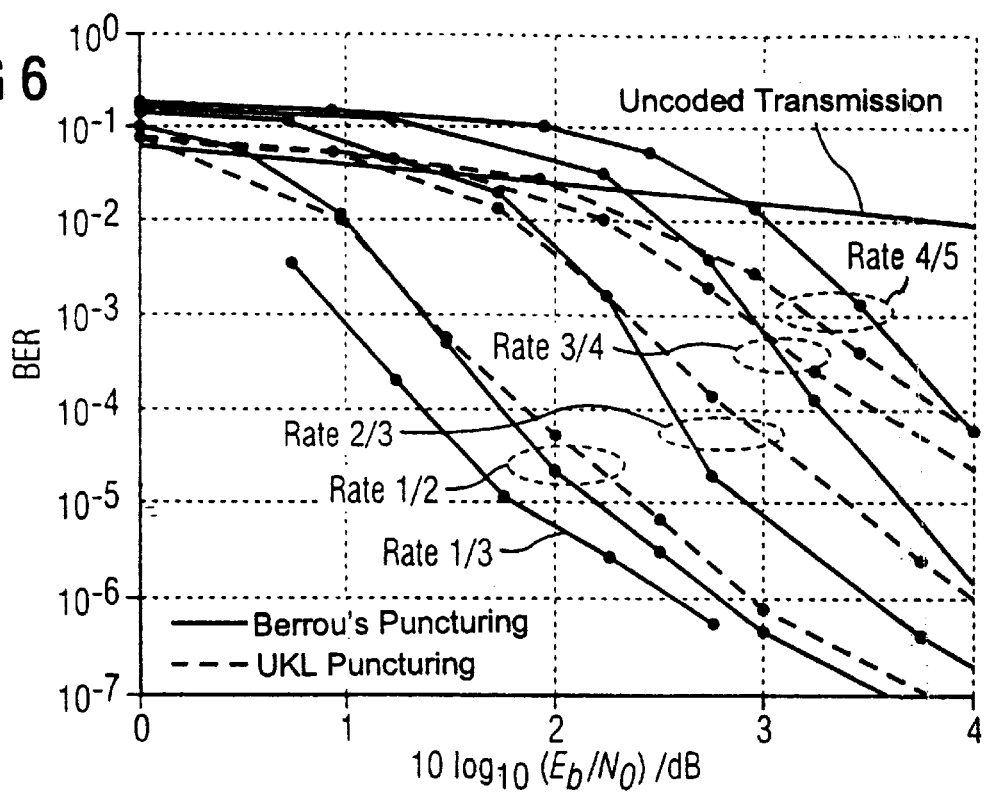
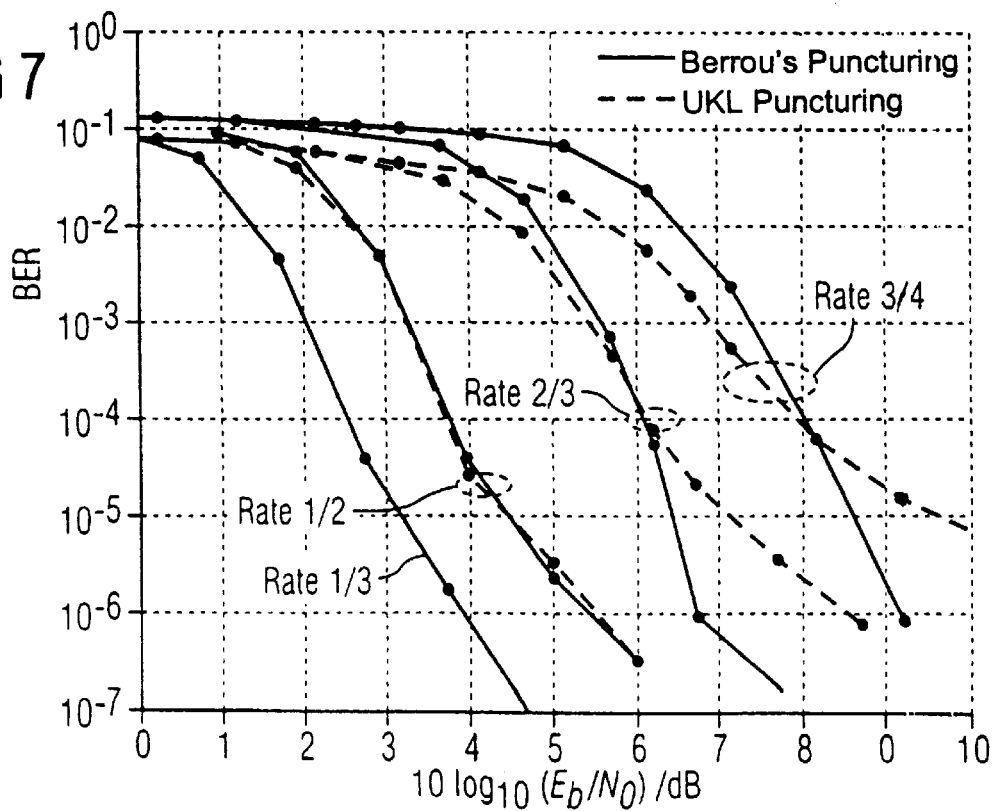

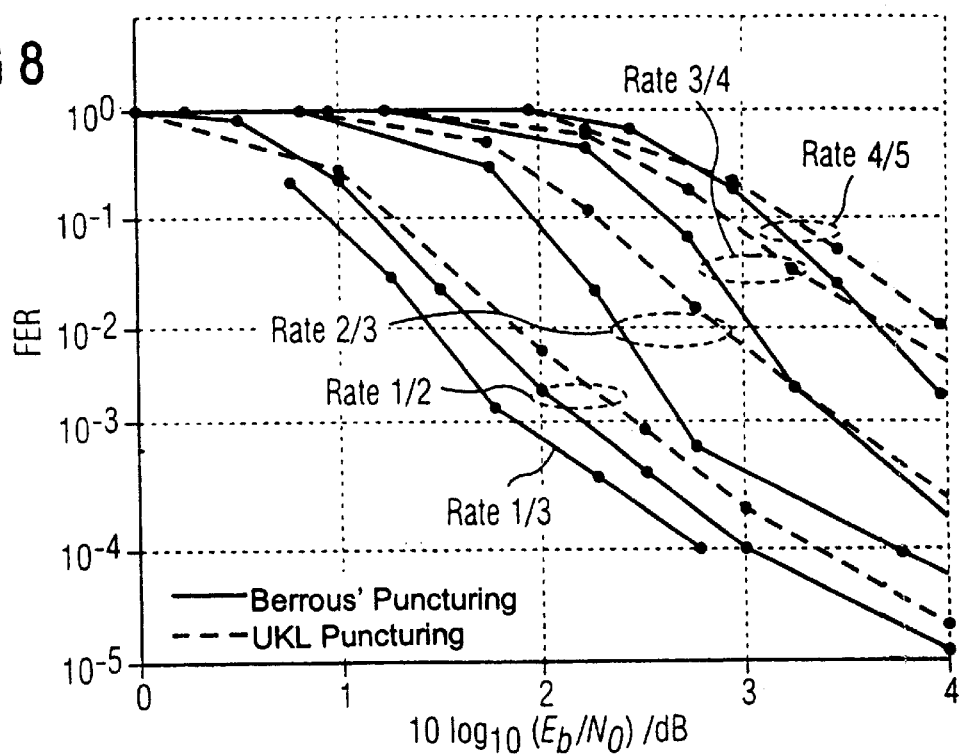
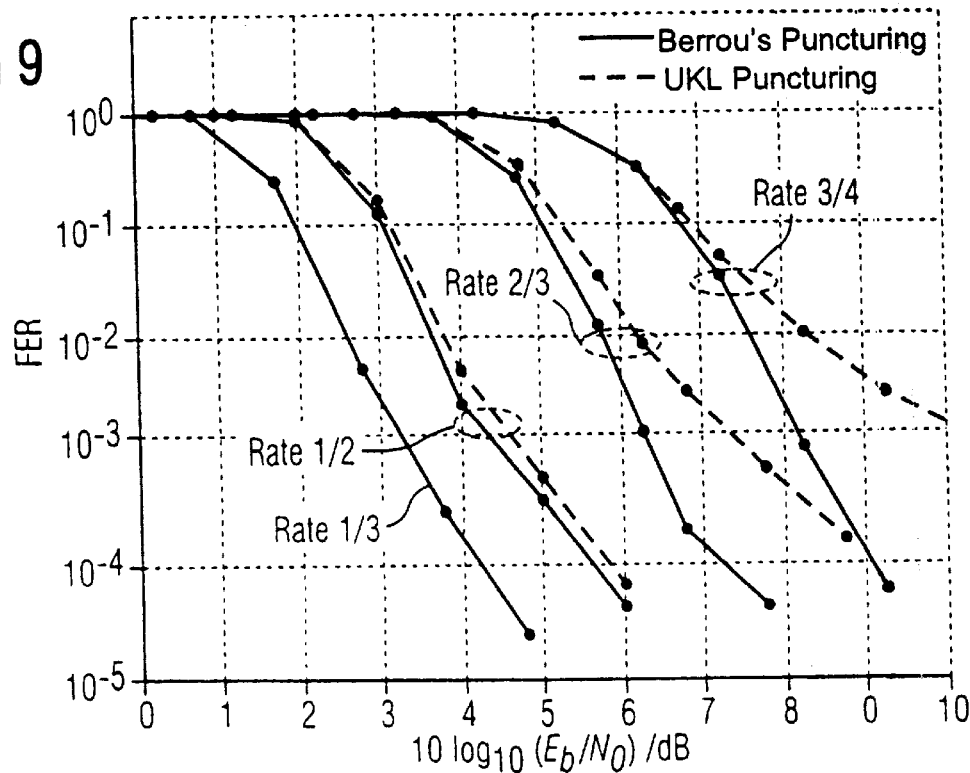

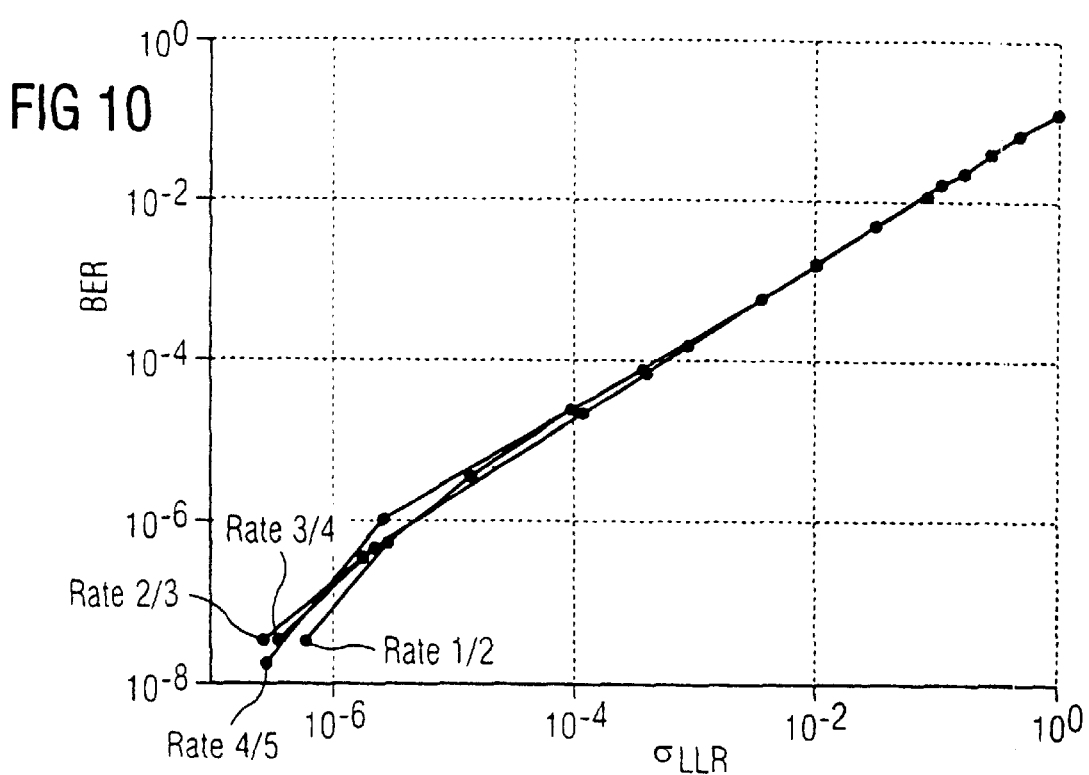
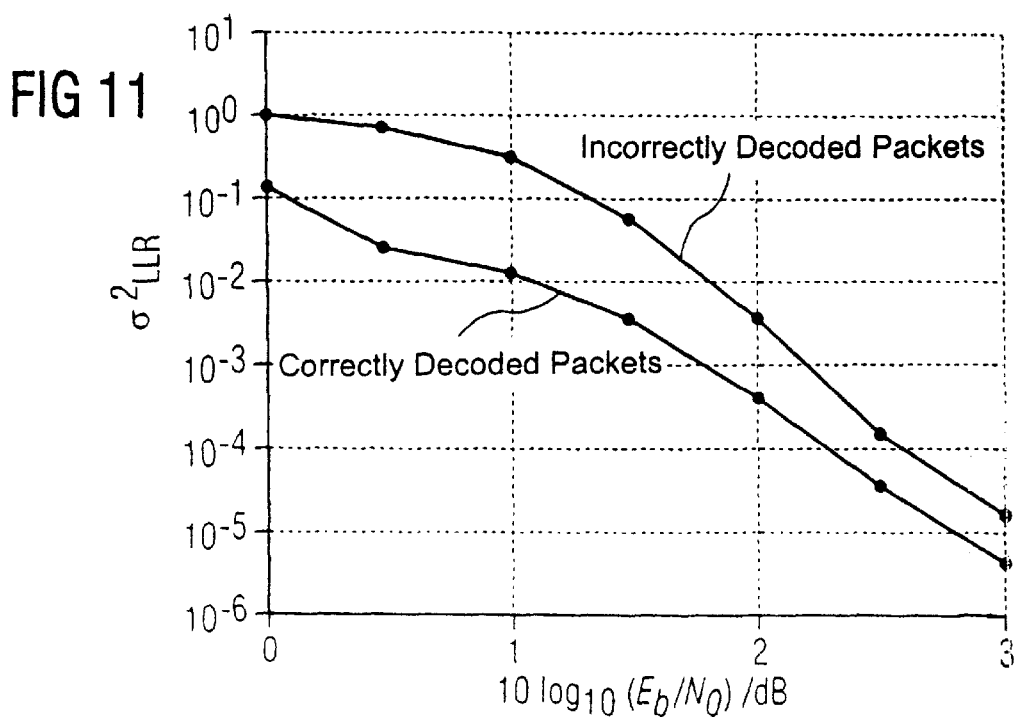

METHOD FOR DATA TRANSMISSION ON TRANSMISSION CHANNELS IN A DIGITAL TRANSMISSION SYSTEM

CROSS-REFERENCE TO RELATED APPLICATION

This is a continuation of copending International Application PCT/DE98/02166, filed Jul. 29, 1998, which designated the United States.

BACKGROUND OF THE INVENTION

FIELD OF THE INVENTION

The invention relates to a method for data transmission on transmission channels in a digital transmission system, in which, for channel coding, turbo coding is carried out in a turbo coder at a transmitter end and turbo decoding with soft-decision output signals is carried out in a turbo decoder at a receiver end.

The use of turbo codes for digital transmission systems is investigated in a reference by P. Jung, titled "Comparison of Turbo-Code Decoders Applied to Short Frame Transmission Systems", IEEE Journal on Selected Areas in Communications, Volume 14 (1996) pages 530–537, with both coders and decoders being investigated for the turbo codes in the transmission path. Decoding of the turbo codes is based on the use of soft-input/soft-output decoders, which can be produced using either maximum a-posteriori (MAP) symbol assessors or MAP sequence assessors, for example an assessor using an a-priori soft-output Viterbi algorithm (APRI-SOVA). This publication describes four different decoder configurations and their capabilities to process specific error rates. Furthermore, the performance of these decoders is investigated for different applications. It has been found that the turbo codes and their iterative decoding are an effective measure against packet errors.

The reference from ICC '95, Seattle, Wash., Jun. 18–22, 1995, titled "Turbo Codes for PCS Applications", D. Divsalar and F. Pollara, proposes turbo codes to achieve error correction virtually as far as the so-called Shannon limit. Relatively simple component codes and large interleavers are intended to be used for this purpose. In this publication, the turbo codes are produced in a coder using multiple codes, and are decoded in a suitable decoder. The turbo codes were introduced by a reference by Berrou et al. 1993 (see C. Berrou, A. Glavieux and P. Thitimayshima, titled "Near Shannon Limit Area Correction Coding: Turbo Codes"Proc. 1993 IEE International conference on communications, pages 1064–1070). On the one hand, this method allows very good error correction to be achieved. So-called turbo equalization is known from ETT European Transactions on Telecommunications, Vol. 6, No. 5, September–October 1995, titled "Iterative Correction of Intersymbol Interference: Turbo-Equalization", Catherine Douillard et al., whose use is intended to overcome the disadvantageous effects of intersymbol interference in digital transmission systems which are protected by convolution codes. The receiver makes two successive soft-output decisions, which are made in an iterative process by a symbol detector and a channel decoder. Each iteration makes use of extrinsic information from the detector and the decoder for the next iteration, as with turbo decoding. It has been found that intersymbol interference effects in multipath channels can be overcome by turbo equalization.

Future transmission systems, for example the European universal mobile telecommunications system (UMTS), require the support of a large number of co-existing carrier services with carrier data rates of up to 2 Mbit/s in a flexible manner, with the best-possible spectral efficiency being desirable. An multiple access (MA) scheme has been developed in the advanced communications technologies and services (ACTS) project AC090 FRAMES (Future Radio Wideband Multiple Access Systems), which is called FRAMES Multiple Access (FMA) and satisfies the UMTS requirements. As a third-generation transmission system, which covers a wide range of application areas, carrier services and widely differing scenarios, FMA must comply with present and future developments of UMTS radio interface standards. FMA contains two operating modes, namely wideband time division multiple access (WB-TDMA) with and without spreading and compatibility with global system for mobile communications (GSM) and wideband code division multiple access (WB-CDMA). Although, essentially, a system based on FMA is considered here, it is also possible to include other transmission systems using multiple access methods, for example frequency division multiple access (FDMA), MC-CDMA (Multicarrier-CDMA) or combinations of the transmission systems.

With regard to the high performance of turbo codes, it is desirable to use these in digital transmission systems. The complex requirements, for example for FMA, results, however, in that it is necessary when using such turbo codes to ensure that the data transmission makes full use of the capabilities of the turbo codes.

The performance of turbo coders and turbo decoders for channel coding using alternative coders and decoders was compared at the 5th International Symposium on Personal, Indoor And Mobile Radio Communications (PIMRC '94), and ICCC Regional Meeting on Wireless Computer Networks (WCN), The Hague, NL, Vol. 2, 18–23 September 1994, pages 524–528; M. Nasshn et al. It is stated that information relating to the system performance is obtained using the turbo decoder by determining the variance of the log-likelihood ratios.

The reference IEEE Transactions on Communications, New York, US, Vol. 43, No. 2/4, Part 2, February 1995, pages 733–737; by R. H. Deng et al., describes a Type I hybrid ARQ system which automatically matches the code rates to the bit error rates of the channel. Punctured convolution codes are used for transmission.

In Published, European Patent Application EP 0 755 122, an adaptive termination criterion is used for iterative decoding of transmitted, multidimensionally coded information. The relative entropy, approximations to the relative entropy or variables similar to it are used as a measure for the change in the weighted decisions for successive iteration step elements.

SUMMARY OF THE INVENTION

It is accordingly an object of the invention to provide a method for data transmission on transmission channels in a digital transmission system which overcomes the above-mentioned disadvantages of the prior art methods of this general type, in which the quality of service of a transmission channel is maintained even with a variable channel quality or changing requirements for the quality of service with a predetermined quality of service, or of improving the quality of service as much as possible.

With the foregoing and other objects in view there is provided, in accordance with the invention, a method for data transmission on transmission channels in a digital transmission system, which includes:

carrying out turbo coding in a turbo coder at a transmitter end for channel coding;

carrying out turbo decoding with soft-decision output signals in a turbo decoder at a receiver end;

determining a quality of service from variances of the soft-decision output signals at the turbo decoder for improving the quality of service; and setting a coding rate by adaptation of puncturing for obtaining a predetermined quality of service.

According to the invention, the method mentioned initially is for this purpose characterized in that, in order to improve the quality of service, the quality of service is determined from the variances of the soft-output signals at the turbo decoder, and in that the coding rate is set by adaptation of the puncturing such that a predetermined quality of service is obtained.

In the method according to the invention, the coding rate is set adaptively by adaptation of the puncturing at the output of the turbo coder. Any increase in the coding rate, that is to say more information being punctured, in this case makes the result of the decoding process worse for a given transmission channel quality. Therefore, the bit error rate (BER) increases. With the method according to the invention, the quality of service achieved on a transmission channel can be identified at the receiver end by use of the variances. If the quality of service is below or above a certain limit, which is normally governed by the service required by the user (voice, data), the coding rate can be adaptively matched in the transmitter, via a return channel. The measurement curves, which will be described in detail later, are used for this purpose. The advantage of the method is the code rate, which is adaptively matched to the channel. In consequence, the maximum possible amount of wanted information for a required service is always transmitted on a transmission channel, since the coding required for error correction is reduced to the minimum necessary extent. Adaptive matching of the coding rate is in general also possible with an RCPTC, although the puncturing of this code is not immediately obvious to a person skilled in the art.

In this document, the term quality of service (QoS) is used as follows. Specific QoS criteria apply to various services, and the definitions of the QoS criteria for various carrier services have been worked out in the course of FRAMES. One important component of a QoS criterion is the carrier data rate R. The QoS criterion also includes a maximum permissible error rate $P_b^G$ or a packet loss rate $P_l^G$ in conjunction with a maximum failure probability $P_{out}^G$. In the case of line-switched services, the probability $P\{P_b > P_b^G\}$ of the instantaneous bit error rate $P_b$ exceeding $P_b^G$ must not be greater than $P_{out}^G$, that is to say $$\Pr\{P_b > P_b^G\} < P_{out}^G.$$

For voice transmission, $P_b^G$ is equal to $10^{-3}$ and $P_{out}^G$ is equal to 0.05. A similar condition for the instantaneous packet loss rate $P_l$ applies to packet services:

$$\Pr\{P_l > P_l^G\} < P_{out}^G.$$

Apart from the criteria relating to Pr, there are also other conditions relating to the QoS criterion. However, the QoS parameters $P_b^G$, $P_l^G$ and $P_{out}^G$ will mainly be considered here, which relate directly to the choice of the error correction code (ECC). For ECC, the coding rate $R_c$ is essentially governed by the multiple access method, the modulation and the packet parameters. In other words, the coding rate $R_c$ is directly related to the question as to whether a QoS criterion is or is not satisfied for a specific service.

In a method in which a soft-input/soft-output symbol or sequence assessor is used at the receiver end, it is advantageous for the Quality of Service to be determined from the variances $\sigma^2$ of the soft-decision output signals from the turbo decoder, with the bit error rate advantageously being calculated from the variances $\sigma^2$, as a measure of the quality of service.

In a method in which an MAP symbol assessor or an MAP sequence assessor is used at the receiver end, it is advantageous for the quality of service to be determined from the variances $\sigma^2_{LLR}$ of the soft-decision output signals from the turbo decoder.

In a method in which a Viterbi algorithm for sequence assessment is used at the receiver end, it is advantageous for the quality of service to be determined from the variances $\sigma^2_{VIT}$ of the soft-decision output signals from the turbo decoder.

Since the method according to the invention can be used not only with MAP assessors but also for assessment using a Viterbi algorithm, there is virtually no limitation with regard to the most important methods for sequence and symbol assessment. This is true even though this statement is used only in conjunction with a MAP symbol assessor in the following specific description.

According to one advantageous refinement, the method according to the invention is characterized in that so-called Berrou's puncturing is used for puncturing, in which only the non-systematic information is punctured. This type of puncturing is advantageous for relatively low signal-to-noise ratio values.

According to one advantageous refinement, the method according to the invention is characterized in that so-called UKL puncturing is used for puncturing, in which both systematic information and non-systematic information are punctured. This type of puncturing is advantageous for relatively high signal-to-noise ratios, and thus for bit error rates of $<10^{-4}$.

According to one advantageous refinement, the method according to the invention is characterized in that the coding rate is increased when the quality of service is higher than the predetermined quality of service, and in that the coding rate is reduced when the quality of service is less than the predetermined quality of service. This allows the best-possible utilization of the channel capacity, since fewer redundant bits need be transmitted and the channel quality is better.

According to one advantageous refinement, the method according to the invention is characterized in that the increase or reduction in the coding rate is carried out in steps between ½ and 1 within the rate-compatible family of coding rates, for example ⅓, ½, ⅔, ¾.

In order to achieve the set object, the method according to the invention for data transmission of the type mentioned initially is characterized in that, in order to improve the quality of service, the quality of service is determined from the variances of the soft-output signals at the turbo decoder, and in that the number of decoding iterations is set as a function of the quality of service. In this case, another variant is used to improve the quality of service, which can be carried out in addition to or alternatively to using the influence of the coding rate on the quality of service.

According to one advantageous refinement, the method according to the invention and as cited above is characterized in that the number of decoding iterations is optimized taking account of the time delay associated with it and the improvement in the decoding result.

Other features which are considered as characteristic for the invention are set forth in the appended claims.

Although the invention is illustrated and described herein as embodied in a method for data transmission on transmission channels in a digital transmission system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a turbo coder for explaining a method according to the invention;

FIG. 2 is a block diagram of an RSC coder, as is used in the turbo coder shown in FIG. 1;

FIG. 3 is a block diagram of a turbo decoder;

FIG. 6 is a graph of the performance of the RCPTC in the AWGN channel as a function of different coding rates;

FIG. 7 is a graph of the performance of the RCPTC in the Rayleigh channel as a function of the different coding rates;

FIG. 8 is a graph of the performance of the RCPTC in the AWGN channel for various coding rates;

FIG. 9 is a graph of the performance of the RCPTC in the Rayleigh channel for various coding rates;

FIG. 10 is a graph of the relationship between a bit error rate BER and a variance $\sigma^2_{LLR}$ of an output of a further decoder; and FIG. 11 is a graph of the variance $\sigma^2_{LLR}$ plotted against a signal-to-noise ratio for incorrectly and correctly decoded packets.

DESCRIPTION OF THE PREFERRED EMBODIMENTS

Figure 4:
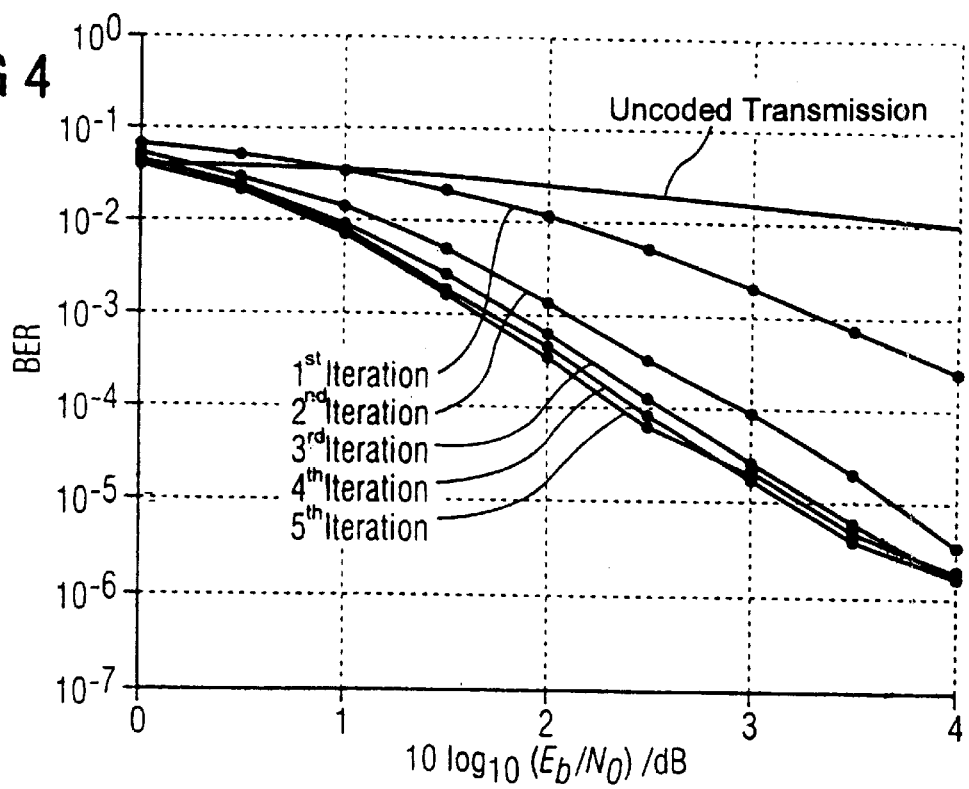
FIG. 4 is a graph of performance of an RCPTC in an AWGN channel as a function of a number of iterations of turbo decoding.

In all the figures of the drawing, sub-features and integral parts that correspond to one another bear the same reference symbol in each case. With regard to an economic use of hardware, an error correction code (ECC) circuit should be usable as universally as possible, while the ECC configuration should allow high flexibility by use of software control. A rate compatible puncture turbo code (RCPTC) used here allows this, since it has the necessary flexibility. Referring now to the figures of the drawing in detail and first, particularly, to FIG. 1 thereof, there is shown a turbo coder 2 that is used for producing the RCPTC.

1. The turbo coder 2 has $N_e$=2 binary, recursive, systematic convolution (RSC) coders 4, 6 with a small constraint length, for example between 3 and 5, which are connected in parallel using a turbo interleaver 8. The input sequence u is supplied to the coder 4 (RSC, Code 1) and, via the turbo code interleaver 8, to the coder 6 (RSC, Code 2) as well as to a puncturing/multiplexing device 10. The puncturing/multiplexing device 10 receives a further input C1 from the coder 4 and a further input C2 from the coder 6. An output of the puncturing/multiplexing device 10 is an output sequence b.

In the turbo coder 2, the minimum code rate $R_{c,min}$ is equal to $1/(N_{e+1})$=1/3. The minimum coding rate $R_{c,min}$ could be further reduced by using additional RSC coders.

The binary input sequence u, which has a finite time duration, is entered in the coder 4, at whose output it produces the redundant sequence $C_1$ with the same finite duration as u. The sequence $u_I$, which represents the sequence u after interleaving, is passed to the coder 6. The coding in the coder 6 results in the redundant sequence $C_2$. The redundant sequences $C_1$ and $C_2$ and the sequence u are punctured and multiplexed, in order to form the output sequence b. The turbo coder 2 is a systematic coder 2, with u being the basis of the systematic information contained in b.

A RSC coder, as can be used for the coders 4 and 6, is shown in FIG. 2, using the example of the coder 4. The sequence u is applied as systematic information to one input of the coder 4. The sequence u passes via an addition element 12 to a delay stage 14 and to a further addition element 16. The output signals from the delay stage 14 pass to a second delay stage 18 and to the addition element 12. The output signals from the second delay stage 18 pass to the addition stage 12 and to the addition stage 16. The output from the addition stage is then the redundant sequence $C_1$.

The hardware costs are a significant factor in the choice of this coder, and should be kept as low as possible. For this reason, the two RSC coders for use in the context of FRAMES are identical and have a constraint length of 3. Although the RSC coders have only four states, their performance is good when the values of the signal-to-noise ratio $E_b/N_0$ are low. The performance of the RCPTC using the coders 4, 6 is thus advantageous at low signal-to-noise ratios.

The output sequence b of the turbo coder 2 passes via the transmission channel and a demodulator to a turbo decoder 22 (FIG. 3), which has an RSC decoder 24 and a second RSC decoder 26. A turbo code interleaver 28 is provided between one output of the decoder 24 and one input of the decoder 26. A turbo code deinterleaver 30 is provided between one output of the decoder 26 and one input of the decoder 24. The decoders 24, 26 are soft-input/soft-output decoders 24, 26.

The demodulator (not shown) supplies assessed values $x_n$ of the systematic information $u_n$ which is contained in u, as well as assessed values $Y_{1,n}$ and $Y_{2,n}$ of the transmitted redundant bits, which have been produced by the coders 4 and 6, respectively. The two decoders 24, 26 require channel state information (CSI), which contains the instantaneous signal amplitudes and the noise variance. Each of the decoders 24, 26 processes the systematic information, the redundant and a-priori information $L_{e1,n}$ and $L_{e2,n}$ while processing the CSI, as a result of which the extrinsic information $L_{e2,n}$ and $L_{e1,n}$ is produced, which is then used as a-priori knowledge in the downstream decoder. The decoding process is iterative, and the result of the decoding process is improved with each iteration. However, the amount of improvement gradually decreases with further iterations. After a certain number of iterations, the output signal from the turbo decoder 22 is supplied to a non-illustrated detector, as is normal for such transmission systems.

In order to match the use of the RCPTC to the existing service requirements, it would be conceivable to adapt the RSC coders, but this would lead to an undesirable additional load with regard to the hardware costs. The matching of the interleaver size to the specific services is known per se and is also a problem when using an RCPTC, owing to its flexibility.

Furthermore, the number of iterations for decoding can be set in accordance with the quality of service (QoS) criterion, taking account of the overall coding complexity. There are two options at the receiver for utilizing this characteristic of the turbo code. For a given QoS criterion, the number of iterations can be increased as the signal-to-noise ratio $E_b/N_0$ rises. This is particularly advantageous in fading channels, for example in transmission channels. On the other hand, the number of iterations can also be varied with a QoS criterion that changes with time. The capability to adjust the number of decoding iterations is available only when using turbo codes, in particular an RCPTC.

A further option for improving the performance in a system with an RCPTC is to set the puncturing so that an RCPTC with varying code rates $R_{c,min} <= R_c <= R_{c,max}$ can be provided, by which the coding characteristics can be changed, without changing the turbo code interleavers or the RSC coders.

In principle, the sequences u, $C_1$ and $C_2$ are available for puncturing. If two of the sequences are completely suppressed by puncturing, the maximum code rate $R_{c,max}=1$ is assumed. In this case, the coding characteristics depend on which of the sequences are punctured. If, for example, the redundant sequences $C_1$ and $C_2$ are completely punctured, with only the sequence u being passed through unchanged, no ECC is available and time diversity gain cannot be achieved in receivers for fading channels. In this situation, the turbo decoder 22 is reduced to a simple threshold-value detector.

If one of the redundant sequences $C_1$ or $C_2$ is completely suppressed by the puncturing process, in which case only the second redundant sequence together with the sequence u can pass through, the turbo coder 2 becomes a conventional RSC coder. The turbo decoder 2 is reduced to an RSC decoder, which is configured to carry out half an iteration. In this case, there is no a-priori knowledge based on extrinsic information. The coding rate $R_c$ may be varied between ½ nand 1, depending on the QoS criterion. Since $N_e=2$, the RSC coders can be based on two different codes, and the QoS criterion and the coding complexity can be varied by suppressing a specific redundant sequence $C_1$, or $C_2$, without changing the coding rate $R_c$.

However, the options mentioned above prevent turbo code operation, which is available only when bits of the two redundant sequences $C_1$, and $C_2$ are transmitted and where $u_n$ and $u_{1,n}$ are contained in u and $u_1$, respectively. In this case, $R_{c,min} <= R_c < 1.$ The minimum coding rate $R_{c,min}=1/(N_e+1)$ is achieved if no puncturing is carried out. In this case, either the conventional RSC decoding or turbo decoding may be provided, depending on the QoS criterion and transmission channel state, with both factors varying with time for transmission applications.

The following versions are possible for real turbo code operation. The sequence u is not punctured, the redundant sequences $C_1$ and $C_2$ are partially punctured. In this case, operation as RSC code or as turbo code is possible, the number of decoding iterations can be adjusted, and the coding rate may be between ⅓ and 1. This type of puncturing is called Berrou's puncturing.

An alternative option is for the sequence u and the redundant sequences $C_1$ and $C_2$ to be partially punctured. In this case, operation with RSC code is impossible, and is possible only with turbo code. The number of decoding iterations can be adjusted, and the coding rate may be between ⅓ and 1. This type of puncturing is called UKL puncturing (UKL=University Kaiserslautern). Finally, the situation may also be considered in which no puncturing takes place. In this case, operation with an RSC code and a turbo code is possible. The number of decoding iterations can be adjusted, and the coding rate is around ⅓.

The advantageous feature of RCPTC is the capability to vary the coding rate $R_c$ adaptively, in which case the required information for an ARQ can be transmitted without having to transmit the entire, coded packet. It is sufficient to transmit an additional part of the information, which compensates for the difference in the coding rate.

Now that the options for adaptation of the coding in the case of RCPTC have been described, the effects of the matching options on the performance of the system using RCPTC will be described, on the basis of simulations.

FIG. 4 shows the performance of the RCPTC as a graph showing the bit error rate (BER) plotted against the signal-to-noise ratio $E_b/N_0$ for voice transmission via an additive white Gaussian noise (AWGN) channel. The packet size was 150 bits, and the coding rate was roughly ⅓. The carrier data rate for voice transmission was 8 kbit/s. The uncoded transmission is shown as a reference line. The parameter for these simulations is the number of decoding iterations, which varies between 1 and 5. After the first decoding iteration, the minimum signal-to-noise ratio which is required to achieve a bit error rate of $<10^{-3}$ is approximately equal to 3.5 dB. After the second decoding iteration, approximately 1.3 dB less is required. The next decoding iteration allows a further gain of 0.2 dB. The next iterations allow gains of less than 0.1 dB. After five iterations, the minimum signal-to-noise ratio that is required for a bit error rate of less than $10^{-3}$ is approximately equal to 1.8 dB. It can thus be seen that the performance improvement becomes less as the number of iterations increases. By comparison, a conventional non-systematic convolutional (NSC) code with a constraint length of 9 requires approximately 1.9 dB to achieve the same bit error rate of $<10^{-3}$. The RCPTC is thus somewhat more powerful than conventional codes, even with packet sizes as small as 150 bits.

Figure 5:
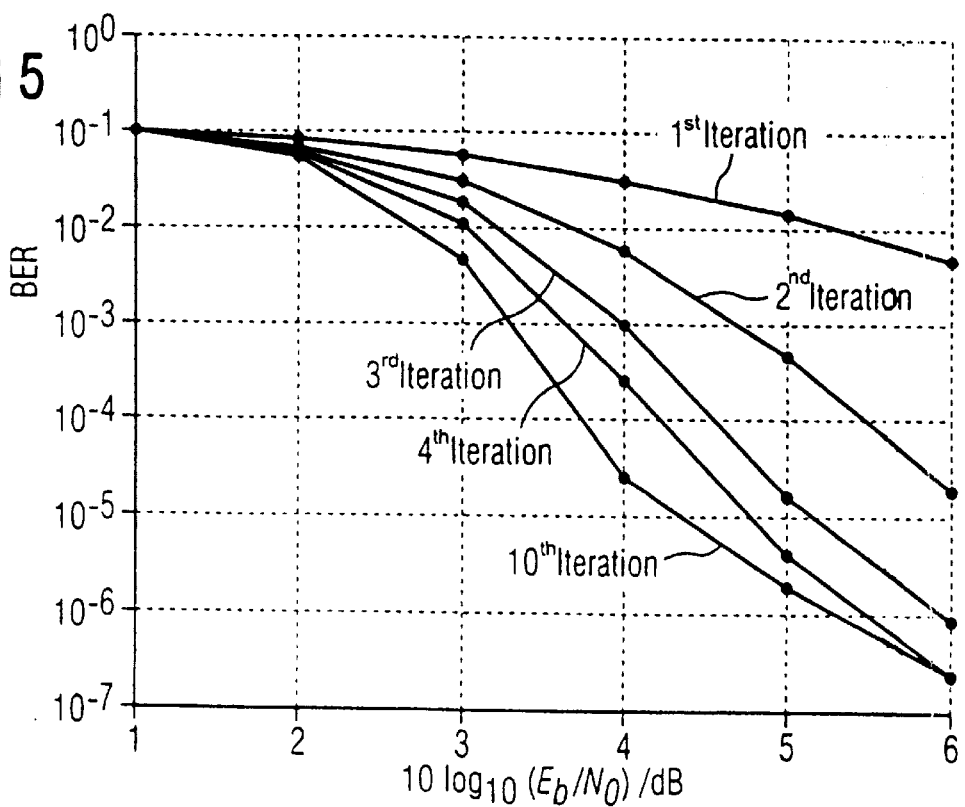
FIG. 5 is a graph of the performance of the RCPTC in a Rayleigh channel for a different number of iterations of turbo decoding.

FIG. 5 shows a graph of the performance of the RCPTC, in which the bit error rates BER are plotted against the signal-to-noise ratio $E_B/N_0$ for narrowband integrated services digital network (ISDN) with a carrier data rate of 144 kbit/s, a packet size of 672 bits, a code rate of about ½ and a Rayleigh fading channel which is completely subjected to interleaving. The simulation parameter is once again the number of decoding iterations. After four decoding iterations, a bit error rate of less than $10^{-3}$ requires a minimum signal-to-noise ratio of 3.8 dB. Only about 3.4 dB is still required after ten iterations. A conventional NSC code with a decoding complexity similar to that of four decoding iterations has a constraint length of 8, and requires a signal-to-noise ratio that is 1.1 dB greater.

FIGS. 6 to 9 show graphs of the performance when using the RCPTC, with the bit error rate BER or the frame error rate (FER), respectively, being plotted against the signal-to-noise ratio $E_B/N_0$. FIG. 6 shows the bit error rate plotted against the signal-to-noise ratio for a packet size of 672 bits, ten decoding iterations and one AWGN channel.

FIG. 7 shows the bit error rate plotted against the signal-to-noise ratio for a packet size of 672 bits, ten decoding iterations and a Rayleigh fading channel which is completely subjected to interleaving.

FIG. 8 shows the frame error rate FER plotted against the signal-to-noise ratio for a packet size of 672 bits, ten decoding iterations and one AWGN channel.

FIG. 9 shows the frame error rate plotted against the signal-to-noise ratio for packet size of 672 bits, 10 decoding iterations and a Rayleigh fading channel which is completely subjected to interleaving. The graphs in FIGS. 6 to 9 use two different puncturing methods, namely Berrou's puncturing and UKL puncturing, which have been mentioned above. As can be seen, Berrou's puncturing has better performance for lower values of the signal-to-noise ratio, while UKL puncturing is advantageous for a high signal-to-noise ratio, and thus for bit error rates of <$10^{-4}$. The intersections move in the direction of lower bit error rates as the coding rates increase.

In FIG. 10, the bit error rate is plotted against the variance of the log-likelihood ratios (LLR) at the output of the second decoder, with an RCPTC, a packet size of 372 bits, ten decoding iterations and one AWGN channel being assumed. It can be seen from FIG. 10 that the coding rate has no effect on the relationship between the bit error rate and the variance $\sigma^2_{LLR}$, since these two variables are similarly dependent on the signal-to-noise ratio $E_B/N_0$. Thus, if $\sigma^2_{LLR}$ is known, the bit error rate can easily be assessed, and this result can be used as a basis for an action, for example adaptation of the number of decoding iterations or adaptation of the coding rate in order to improve the transmission quality or, in the case of ARQ, to request a repeat transmission of an incorrectly coded packet.

Finally, FIG. 11 shows the variance $\sigma^2_{LLR}$ of the log-likelihood ratio LLR of the output of the second decoder plotted against the signal-to-noise ratio $E_B/N_0$ when using an RCPTC with a packet size of 600 bits, a code rate of about 5/9, ten decoding iterations and one AWGN channel. The RCPTC was configured for a 64 kbit/s carrier service. From FIG. 11, it can be seen that a similar consideration to that in connection with FIG. 10 also applies to the dependency of the variance $\sigma^2_{LLR}$ on the occurrence of packet errors. $\sigma^2_{LLR}$ for incorrectly decoded packets is always greater than $\sigma^2_{LLR}$ for correctly decoded packets. Thus, if the signal-to-noise ratio $E_B/N_0$ and $\sigma^2_{LLR}$ are known for a packet which is currently being checked, a soft-decision variable, which is related to the probability of a packet error, can easily be produced and used for control purposes.

Although the present description relates mainly to use of the invention with digital mobile telephones, the invention is not limited to this but can in general be used for digital transmission systems, for example power-based systems, optical transmission systems (infrared and laser transmission systems), satellite radio systems, deep-space transmission systems, radio-link transmission systems and broadcast-radio transmission systems (digital radio or TV), with the said advantages.

We claim:

1. A method for data transmission on transmission channels in a digital transmission system, which comprises:

carrying out turbo coding in a turbo coder at a transmitter end for channel coding;

carrying out turbo decoding with soft-decision output signals in a turbo decoder at a receiver end;

determining a quality of service from variances of the soft-decision output signals at the turbo decoder for improving the quality of service; and setting a coding rate by adaptation of puncturing for obtaining a predetermined quality of service.

2. The method according to claim 1, which comprises:

using one of a soft-input/soft-output symbol assessor and a sequence assessor at the receiver end; and determining the quality of service from variances $\sigma^2$ of the soft-decision output signals from the turbo decoder.

3. The method according to claim 2, which comprises calculating a bit error rate from the variances $\sigma^2$ as a measure of the quality of service.

4. The method according to claim 2, which comprises using one of a maximum a-posteriori (MAP) symbol assessor and a MAP sequence assessor at the receiver end, and determining the quality of service from variances $\sigma^2_{LLR}$ of the soft-decision output signals from the turbo decoder.

5. The method according to claim 1, which comprises using Berrou's puncturing for the puncturing in which only non-systematic information is punctured.

6. The method according to claim 1, which comprises using University Kaiserslautern (UKL) puncturing for the puncturing in which both systematic information and non-systematic information are punctured.

7. The method according to claim 1, which comprises increasing the coding rate if the quality of service is higher than the predetermined quality of service, and reducing the coding rate if the quality of service is less than the predetermined quality of service.

8. The method according to claim 7, which comprises carrying out changes, including increases and reductions, in the coding rate in steps between ½ and 1 within a rate-compatible family of coding rates.

9. The method according to claim 8, which comprises changing the coding rate in steps of ⅓, 1/2, 2/3 and ¾.

10. A method for data transmission on transmission channels in a digital transmission system, which comprises:

carrying out turbo coding in a turbo coder at a transmitter end for channel coding;

carrying out turbo decoding with soft-decision output signals in a turbo decoder at a receiver end;

determining a quality of service from variances of the soft decision output signals at the turbo decoder for improving the quality of service;

setting a coding rate by adaptation of puncturing for obtaining a predetermined quality of service; and setting a number of decoding iterations in dependence on the quality of service for improving the quality of service.

11. The method according to claim 10, which comprises optimizing the number of decoding iterations by taking account of a time delay associated with it and an improvement in a decoding result.

* * * * *